United States Patent
Høvesten et al.

(10) Patent No.: US 8,094,846 B2
(45) Date of Patent: Jan. 10, 2012

(54) DEEP SUB-MICRON MOS PREAMPLIFIER WITH THICK-OXIDE INPUT STAGE TRANSISTOR

(75) Inventors: Per F. Høvesten, Ballerup (DK); Lars Jørn Stenberg, Roskilde (DK)

(73) Assignee: Epcos PTE Ltd., Singapore (SG)

( * ) Notice: Subject to any disclaimer, the term of this patent is extended or adjusted under 35 U.S.C. 154(b) by 1057 days.

(21) Appl. No.: 11/958,103

(22) Filed: Dec. 17, 2007

(65) Prior Publication Data

US 2008/0152171 A1 Jun. 26, 2008

Related U.S. Application Data

(60) Provisional application No. 60/875,452, filed on Dec. 18, 2006.

(51) Int. Cl.
*H01L 25/00* (2006.01)
*G01L 9/00* (2006.01)

(52) U.S. Cl. .......................... 381/312; 257/419
(58) Field of Classification Search .................. 381/111, 381/113, 120, 312; 438/50–53; 257/415–419, 257/E21.613, E29.324
See application file for complete search history.

(56) References Cited

U.S. PATENT DOCUMENTS

| | | | | |
|---|---|---|---|---|
| 6,181,193 | B1 | 1/2001 | Coughlin, Jr. | 327/534 |
| 6,642,543 | B1 | 11/2003 | El Gamal et al. | 257/72 |
| 6,977,543 | B2 | 12/2005 | Heedley et al. | 327/563 |
| 7,110,560 | B2 * | 9/2006 | Stenberg | 381/113 |
| 7,149,317 | B2 | 12/2006 | LaFort | 381/122 |
| 7,271,651 | B2 * | 9/2007 | Chen et al. | 330/253 |
| 2004/0085137 | A1 | 5/2004 | Furst et al. | 330/311 |
| 2004/0202345 | A1 | 10/2004 | Stenberg et al. | 381/369 |
| 2005/0151589 | A1 | 7/2005 | Fallesen | 330/259 |
| 2006/0290426 | A1 | 12/2006 | Chen et al. | 330/253 |
| 2007/0009111 | A1 * | 1/2007 | Stenberg et al. | 381/113 |

FOREIGN PATENT DOCUMENTS

| | | |
|---|---|---|
| EP | 1 233 451 A2 | 3/1984 |
| EP | 1 096 831 A2 | 8/2000 |
| EP | 1 599 067 A2 | 5/2005 |
| JP | 03196677 | 12/1989 |
| WO | WO 01/91280 A1 | 11/2001 |
| WO | WO 02/073792 A2 | 9/2002 |
| WO | WO 03/007356 | 1/2003 |
| WO | WO 2004/057909 A2 | 7/2004 |
| WO | WO 2005/011108 A2 | 2/2005 |
| WO | WO 2005/055406 A1 | 6/2005 |

OTHER PUBLICATIONS

Park, Won K. et al, "Effect of Capping Silicon Nitride Layer and Nitrided Gate Oxide on Hump of Transistors." IEEE Electron Device Letters, vol. 25, No. 8, Aug. 2004 (3 pages).

* cited by examiner

*Primary Examiner* — Calvin Lee
(74) *Attorney, Agent, or Firm* — Nixon Peabody LLP

(57) ABSTRACT

The present invention relates to a condenser microphone assembly comprising a condenser microphone transducer comprising adjacently positioned diaphragm and back-plate members having an air gap there between. Moreover, the assembly comprises a deep sub-micron MOS integrated circuit die comprising a preamplifier comprising a first signal input terminal for receipt of electrical signals generated by the condenser microphone transducer. The first signal input terminal is operatively coupled to an input stage of the preamplifier, said input stage comprising a thick-oxide transistor. The present invention further relates to a deep sub-micron MOS integrated circuit die comprising a thick-oxide transistor-based preamplifier.

28 Claims, 3 Drawing Sheets

DEEP SUB-MICRON MOS PREAMPLIFIER WITH THICK-OXIDE INPUT STAGE TRANSISTOR

CROSS-REFERENCE TO RELATED APPLICATIONS

This application claims the benefit of the U.S. Provisional Application 60/875,452, filed on Dec. 18, 2006, entitled "Deep Sub-Micron MOS Preamplifier With Thick-Oxide Input Stage Transistor," which is hereby incorporated by reference in its entirety.

FIELD OF THE INVENTION

The present invention relates to an integrated circuit die and a condenser microphone assembly comprising such integrated circuit die. The integrated circuit die is fabricated in a deep sub-micron MOS technology and it comprises a preamplifier comprising an input stage comprising a thick-oxide MOS transistor.

BACKGROUND OF THE INVENTION

Modern MOS, in particular CMOS, integrated circuit fabrication technologies advance with ever shrinking device geometries to allow an increasing density of active elements, such as transistors. However, the shrinking of geometries puts among other things, severe limitations on allowable maximum voltages in the circuits so as to avoid for example gate oxide destructive breakdown in transistors. One way of overcoming these limitations in certain cases, is to offer so-called thick-oxide transistor devices suitable for higher voltage operation. Thus, by increasing the thickness of the gate oxide layer, a transistor can be operated at a relatively high voltage potential.

Various documents within the technical field of electronics incorporating amplifiers and/or buffers suitable for processing signals generated by electro-acoustic transducers can be found in the patent literature. Examples of such documents are WO 02/073792, US 2004/0202345, US 2005/0151589, US 2007/0009111, U.S. Pat. No. 7,149,317 and EP 1 599 067 which have all been filed by the assignee of the present invention. However, the disclosures of all of these documents all relate to electronics incorporating only thin-oxide transistors.

A less appreciated characteristic of deep sub-micron CMOS technologies is the use of oxy-nitrides to realize very thin gate oxides needed for typical thin-oxide transistors. For deep sub-micron technologies with a minimum feature size below 0.35 micron oxy-nitrides replace conventional silicon oxide as the gate oxide material of choice. A significant disadvantage of using oxy-nitrides is a dramatic increase in transistor flicker noise arising from an increased carrier trap density found in oxy-nitride gate materials. As thin-oxide transistors as a consequence of the thin gate oxide at the same time exhibit a much higher capacitance per unit gate area the noise performance of certain types of preamplifiers, in particular preamplifiers suitable for capacitive transducers, such as miniature condenser microphones and miniature electric microphones, may suffer dramatically.

Thus, an object of the present invention may be seen as to provide a MOS transistor-based preamplifier with a low-noise input stage realized in a deep sub-micron MOS technology, the MOS transistor-based low-noise input stage featuring a very low flicker noise level.

SUMMARY OF THE INVENTION

The above-mentioned object is complied with by providing, in a first aspect, a deep sub-micron MOS integrated circuit die comprising a preamplifier comprising a first signal input terminal for receipt of electrical signals generated by an associated electro-acoustical transducer, said first signal input terminal being operatively coupled to an input stage of the preamplifier, said input stage comprising a thick-oxide transistor.

By the term "input stage" is meant the amplifying or buffering transistor device of the preamplifier closest to a signal input terminal adapted to receive a signal or signals from the associated electrical transducer, such as a condenser microphone transducer or cartridge.

As a thick-oxide transistor exhibits a low gate capacitance per unit gate area, and since flicker noise is known to be reduced by increasing the gate dimensions of the transistor, thick-oxide transistors with increased gate dimension may advantageously be used to amplify or buffer signals from for example capacitive microphone transducers, such as condenser microphone transducers or cartridges having source capacitances within the range 0.5-10 pF. Noise optimum coupling may often be achieved when the source/generator capacitance is close to the input capacitance of the first stage in the amplifier or buffer.

The thickness of a gate oxide of the thick-oxide transistor may be within the range 4-40 nm, such as within the range 8-20 nm, such as approximately 13.5 nm.

The thick-oxide transistor may comprise a P-type or N-type MOS transistor having a gate capacitance appropriately matched to the transducer or source capacitance. Thus, for miniature condenser microphone transducer or cartridges, an input capacitance of the first signal input terminal may be less than 50 pF, such as less than 40 pF, such as less than 30 pF, such as less than 10 pF, such as less than 5 pF. Similarly, an input impedance of the first signal input terminal may be larger than 10 GΩ, such as larger than 50 GΩ, such as larger than 100 GΩ, or even more preferably larger than 1000 GΩ.

The thick-oxide transistor of the deep sub-micron MOS integrated circuit die may have a gate capacitance within the range 0.5-10 pF, such as within the range 1-8 pF, or even more preferably within the range 2-6 pF.

In one embodiment of the invention, particularly well-suited for coupling to a MEMS microphone transducer with a generator capacitance of about 5-6 pF, gate dimensions (W/L) of the PMOS input transistor of the preamplifier is chosen to 600 μm/1 μm.

The preamplifier may further comprise a second signal input terminal operatively coupled to a source input of the P-type MOS transistor, while the first signal input terminal may be operatively coupled to a gate input of the P-type or N-type MOS transistor. The first and second signal input terminals are operatively connectable to associated diaphragm and back-plate members, respectively, of the associated condenser microphone transducer. In another embodiment of the invention the preamplifier comprises a differential input stage that comprises a pair of thick-oxide NMOS or PMOS transistors.

The first signal input terminal of the deep sub-micron MOS integrated circuit die may be coupled to the thick-oxide transistor via a DC blocking capacitor. The DC blocking capacitor may have a capacitance within the range 5-500 pF.

In addition, the deep sub-micron MOS integrated circuit die may further comprise a microphone bias voltage source adapted to provide a predetermined DC bias voltage between a pair of terminals of the deep sub-micron MOS integrated circuit die so as to provide a DC bias voltage between the associated diaphragm and back-plate members. The microphone bias voltage source may provide the DC bias voltage to the first signal input terminal which may be connected to a high-impedance element ensuring the before-mentioned input impedance of 10-1000 GΩ, or even higher. The high-impedance element may comprise, for example, one or more resistors, one or more diode coupled transistors or one or more pairs of reversed biased semiconductor diodes. The bias voltage may be in the range 4-10 V.

The deep sub-micron MOS integrated circuit die may further comprise a voltage regulator adapted to provide a regulated DC voltage, the voltage regulator being operatively coupled to the source input of the P-type or N-type MOS transistor.

The deep sub-micron MOS integrated circuit die according to the first aspect of the present invention may exhibit a A-weighted input referred noise, referred to the first signal input terminal, being less than 2 μV RMS, such as less than 1 μV RMS. Similarly, a flicker noise corner of an input referred noise voltage density may be less than 1 kHz, such as less than 500 Hz, such as less than 100 Hz.

The gate oxide of the thick-oxide transistor may comprise nitrided silicon-dioxide.

In a second aspect, the present invention relates to a condenser microphone assembly comprising a condenser microphone transducer comprising adjacently positioned diaphragm and back-plate members having an air gap there between, and a deep sub-micron MOS integrated circuit die comprising a preamplifier comprising a first signal input terminal for receipt of electrical signals generated by the condenser microphone transducer, said first signal input terminal being operatively coupled to an input stage of the preamplifier, said input stage comprising a thick-oxide transistor.

The condenser microphone transducer may have a transducer capacitance between 0.5 and 10 pF. The condenser microphone transducer may comprise a MEMS microphone transducer, such as a silicon-based transducer comprising a displaceable diaphragm and a back-plate having air ventilation channels arranged therein. The displaceable diaphragm may be highly electrically conductive to allow it to electrically shield the bulk of the condenser microphone from significant capacitive coupling to the back-plate.

The condenser microphone assembly may further comprise a microphone housing or casing having a sound input port acoustically connected to the condenser microphone transducer, preferably via an acoustical channel. In this way acoustical signals are guided from the exterior of the microphone housing or casing to the condenser microphone transducer. The acoustical channel extending from the sound inlet port to a sound inlet of the condenser microphone transducer may form an acoustical seal to the interior of the remaining volume of the microphone housing or casing. The microphone housing or casing may in addition comprise a plurality of externally accessible electrical terminals in order to provide electrical signals to and from the condenser microphone assembly. Such electrical signals may include power supply signals, output signals representing measured acoustical signals etc. The deep sub-micron MOS integrated circuit die may, preferably, be arranged inside the microphone housing or casing.

The preamplifier may further comprise a second input terminal, wherein the first and second signal input terminals are operatively coupled to the diaphragm and back-plate members, respectively.

The thick-oxide transistor of the preamplifier may comprise a P-type MOS transistor or N-type MOS transistor. The thickness of a gate oxide of the thick-oxide transistor may be within the range 4-40 nm, such as within the range 8-20 nm.

The deep sub-micron MOS integrated circuit die may further comprise a microphone bias voltage source adapted to provide a predetermined DC bias voltage between a pair of terminals of the deep sub-micron MOS integrated circuit die. The bias voltage source may be adapted to provide a DC bias voltage within the range 4-10 V. The microphone bias voltage source may provide the DC bias voltage to the first signal input terminal which may be connected to a high-impedance element ensuring the before-mentioned input impedance of 10-1000 GΩ, or even higher. The high-impedance element may comprise one or more resistors, one or more diode coupled transistors or one or more pairs of reversed biased semiconductor diodes.

Moreover, the first signal input terminal may be coupled to the thick-oxide transistor via a DC blocking capacitor. The DC blocking capacitor may have a capacitance within the range 5-500 pF.

The first signal input terminal may have an input capacitance of less than 50 pF, such as less than 40 pF, such as less than 30 pF, such as less than 20 pF, such as less than 10 pF, such as less than 5 pF. Similarly, an input impedance of the first signal input terminal may be larger than 10 GΩ, such as larger than 50 GΩ, such as larger than 100 GΩ, or even more preferably larger than 1000 GΩ.

A gate capacitance of the thick-oxide transistor may be within the range 0.5-10 pF, such as within the range 1-8 pF, or even more preferably within the range 2-6 pF.

The deep sub-micron MOS integrated circuit die of the condenser microphone assembly may exhibit a A-weighted input referred noise, referred to the first signal input terminal, being less than 2 μV RMS, such as less than 1 μV RMS. Similarly, a flicker noise corner of an input referred noise voltage density may be less than 1 kHz, such as less than 500 Hz, such as less than 100 Hz.

The gate oxide of the thick-oxide transistor may comprise nitrided silicon-dioxide.

In a third aspect, the present invention relates to a portable communication device comprising a deep sub-micron MOS integrated circuit die according to the first aspect of the present invention, said portable communication device being selected from the group consisting of: cell phones, hearing aids, PDAs, game consoles, portable computers, and any combination thereof.

In a fourth aspect, the present invention relates to a portable communication device comprising a condenser microphone assembly according to the second aspect of the present invention, said portable communication device being selected from the group consisting of: cell phones, hearing aids, PDAs, and any combination thereof.

BRIEF DESCRIPTION OF THE DRAWINGS

The present invention will now be explained in greater details with reference to the accompanying figures, within

Figure 1:
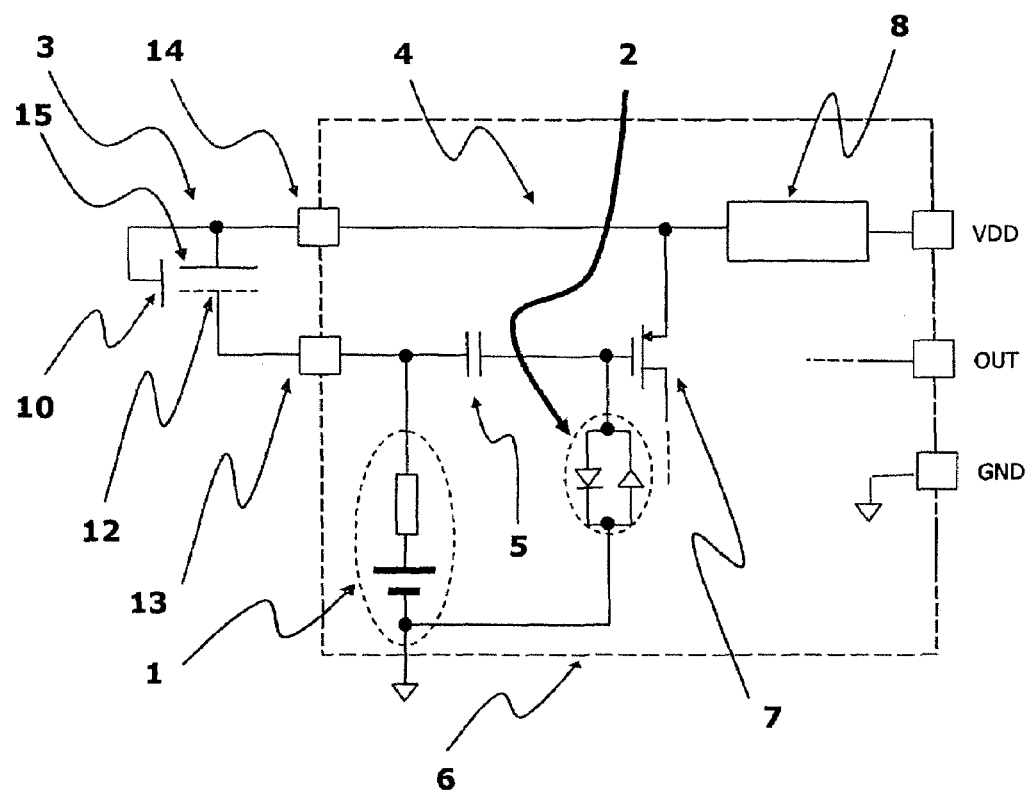
FIG. 1 shows a simplified schematic of a microphone preamplifier input stage.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE INVENTION

In its most general aspect the present invention relates to a deep sub-micron MOS, such as CMOS, integrated circuit die comprising a preamplifier. The preamplifier comprises a first signal input terminal for receipt of electrical transducer signals generated by for example condenser microphone transducers. The first signal input terminal is operatively coupled to an input stage of the preamplifier, said input stage comprising a thick-oxide transistor exhibiting superior properties in terms of flicker noise level and input capacitance.

FIG. 1 illustrates a silicon-based microphone assembly according to one embodiment of the present invention. A high impedance DC bias voltage source 1 for a condenser transducer element 3 and a DC blocking capacitor 5 are both integrated on the electronic or integrated semiconductor circuit die 6 together with an input stage thick-oxide P-type field effect transistor 7, which preferably is a PMOS transistor, and an optional voltage regulator 8. The high impedance DC bias voltage source 1 is shown schematically as a cascade of a DC bias voltage generator and a large series resistor. The high impedance DC bias voltage source 1 may in fact comprise a voltage pump or multiplier, such as Dickson voltage multiplier, utilizing a supply voltage (VDD) of the integrated circuit die 6 to generate a multiplied higher DC voltage. In one embodiment of the invention, a nominal supply voltage of 1.8 volt is multiplied to generate a high impedance DC bias voltage of about 8 volts.

The thick-oxide PMOS transistor 7 references the voltage supply node 14. The voltage supply node 14 may be derived directly from the external power supply voltage VDD of the microphone assembly, or alternatively, it may be derived by regulating and stabilizing the external supply voltage VDD by a regulator circuit 8. The regulator circuit 8 provides the low output impedance required for coupling to the PMOS transistor 7 amplifying element.

The back-plate terminal 13 and the diaphragm terminal 14 (also called voltage node) of the condenser transducer element 3 are referenced to the same node as the input stage of the preamplifier. Supply noise on the voltage supply node 14 is significantly attenuated because any signal on 14 will commonly be applied to the gate input of the PMOS transistor 7 of the microphone preamplifier and therefore not amplified. Furthermore, the input stage comprises the thick-oxide PMOS transistor 7, which often has superior flicker noise properties compared to a NMOS transistor. For this reason, both white noise and flicker noise of the input stage are reduced to a minimum.

The thick-oxide PMOS transistor 7 preferably has a width (W) between 100 and 5000 μm and a length between 0.5 and 5 μm. The thickness of a gate oxide of the thick-oxide PMOS transistor 7 is usually within the range 4-40 nm for submicron CMOS processes and is determined by the selected semiconductor process. The gate capacitance of the PMOS transistor is preferably smaller than the condenser microphone transducer capacitance—for example about 10 pF. However, the gate capacitance can also be smaller, such as about 5 pF or even smaller.

The DC bias current is preferably set to a value between 10 μA and 100 μA for microphone assemblies targeted for battery-powered portable communication devices but other DC bias current values may be selected in other types of applications.

As previously stated, a first externally accessible terminal 13 and a second externally accessible terminal 14 are operatively coupled to the gate and source inputs, respectively, of PMOS transistor 7. The first externally accessible terminal 13 is furthermore coupled to high impedance DC bias voltage source 1 to allow this externally accessible terminal to be electrically coupled to a back-plate 12 or a diaphragm 15 of an associated condenser transducer element 3. The gate input of the PMOS transistor 7 is electrically shielded from the DC bias voltage provided on the first externally accessible terminal 13 by the DC blocking capacitor 5 to allow setting the DC bias point of the PMOS transistor 7 through an independent bias setting network 2 comprising a pair of reverse biased diodes. Such a pair of reversed biased diodes ensures an input impedance higher than 100 GΩ of the input stage of the preamplifier. In fact, a pair of parallel diodes in reverse polarity may have an impedance of several TΩ. In case the preamplifier is to be integrated in an ASIC, the pair of parallel diodes coupled in reverse polarity may advantageously be integrated therewith.

Figure 2:
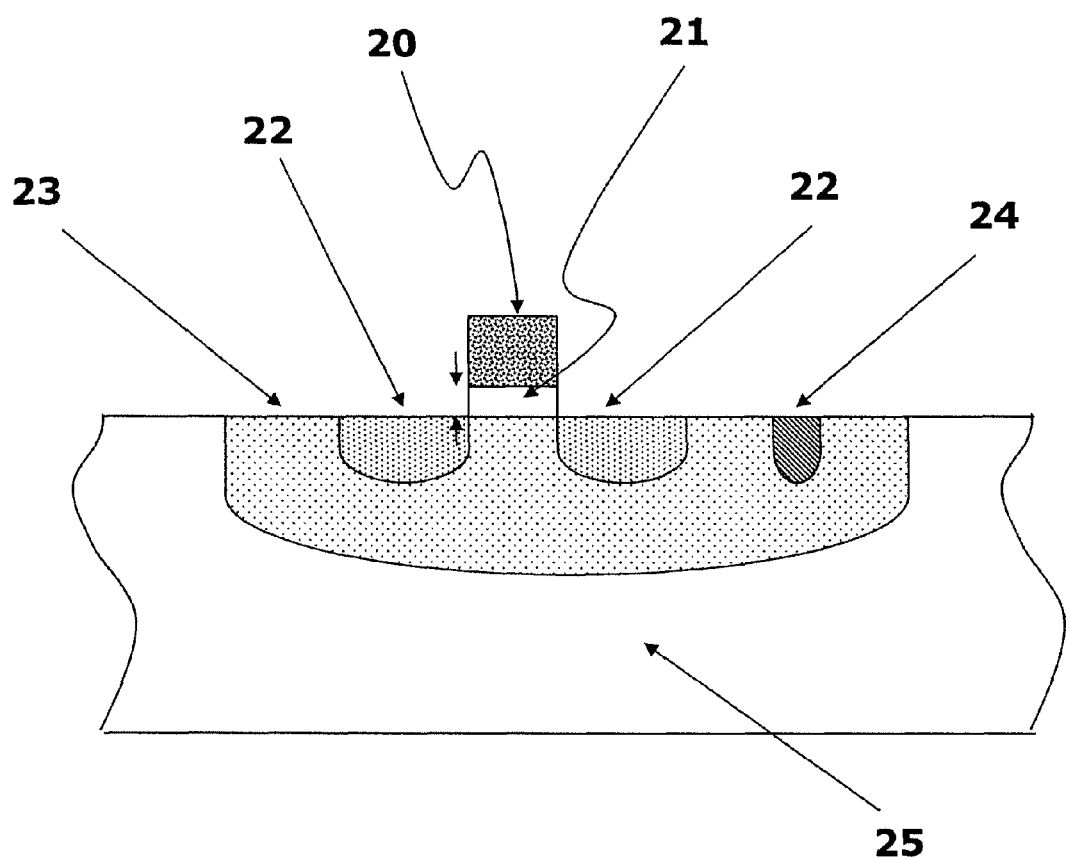
FIG. 2 shows a cross-sectional view of a thin-oxide PMOS transistor.
Figure 3:
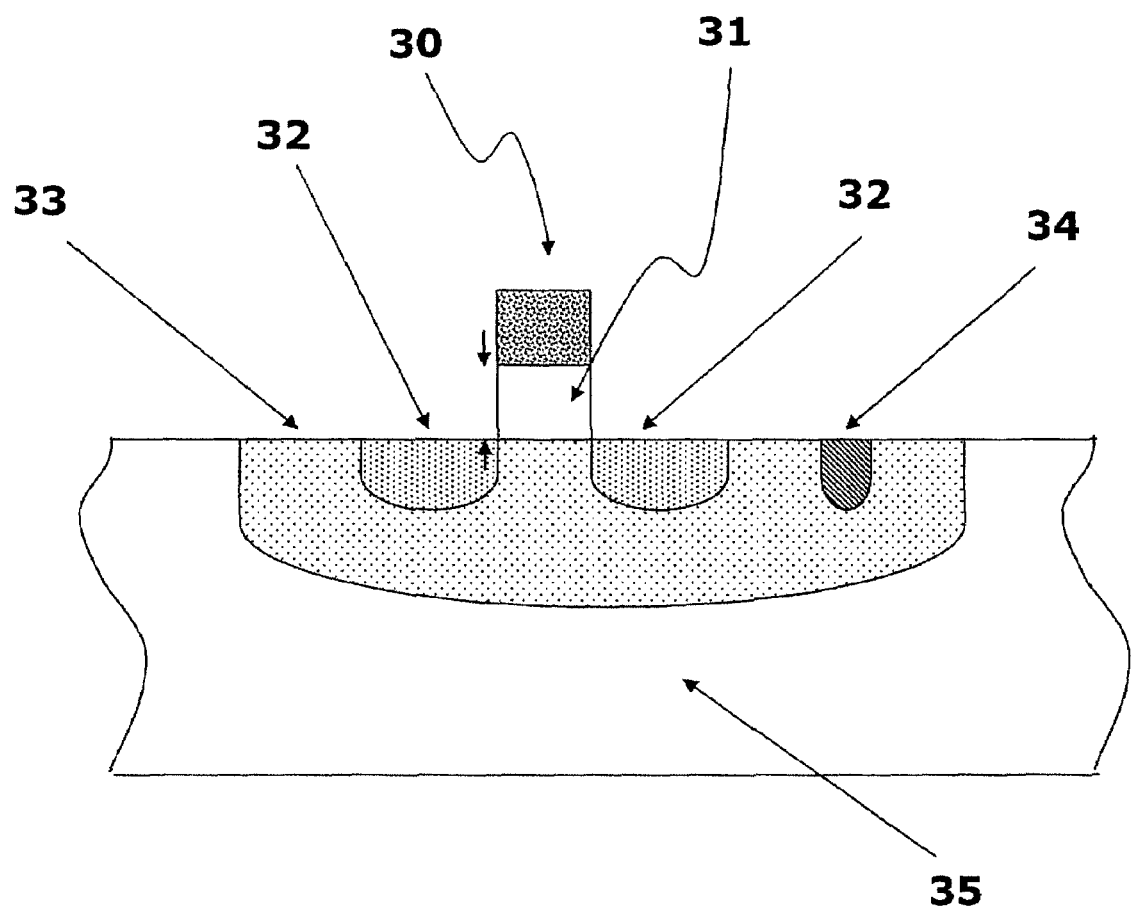
FIG. 3 shows a cross-sectional view of a thick-oxide PMOS transistor.

FIGS. 2 and 3 illustrate the difference between a thin-oxide transistor and a thick-oxide transistor. FIG. 2 shows a cross-sectional view of a substrate 25 supporting a well region 23. Within the well region 23 the source and drain (both denoted 22) are arranged. The gate 20 of the transistor is arranged on a thin oxide layer 21 which separates the gate 20 of the transistor with the well region 23. Contact 24 is provided for obtaining electrical contact to the well region 23.

FIG. 3 shows a cross-sectional view of a substrate 35 supporting a well region 33. Within the well region 33 the source and drain (both denoted 32) are arranged. The gate 30 of the transistor is arranged on a thick oxide layer 31 which separates the gate 30 of the transistor with the well region 33. Compared to FIG. 2 the thickness of oxide-layer 31 is significantly larger than oxide layer 21. Gate oxide layer 31 has a thickness within the range 4-40 nm, such as 13.5 nm for one suitable CMOS process, whereas a typical thickness of gate oxide layer 21 is 3.6 nm in the same CMOS process. Contact 34 is provided for obtaining electrical contact to the well region 33.

The substrate of the die is usually low-doped silicon (P- or N-type). The well regions are usually the same silicon-base material (P- or N-type) but doped with higher levels. The gate material is typically poly-silicon and the gate oxide is nitrided silicon-dioxide ("oxy-nitride").

Circuit die dimensions are typically within the range 0.01-25 mm$^2$. The transistor footprint on die is typically within the range 100-1,000,000 μm$^2$.

The invention claimed is:

1. A deep sub-micron MOS integrated circuit die comprising a preamplifier comprising a first signal input terminal for receipt of electrical signals generated by an associated electro-acoustical transducer, said first signal input terminal being operatively coupled to an input stage of the preamplifier, said input stage comprising a thick-oxide transistor, said electro-acoustical transducer having a transducer capacitance within the range of 0.5-10 pF, and wherein a gate capacitance of the thick-oxide transistor is within the range of 0.5-10 pF and a thickness of a gate oxide of the thick-oxide transistor is within the range of 8-40 nm.

2. A deep sub-micron MOS integrated circuit die according to claim 1, wherein the thick-oxide transistor comprises a P-type MOS transistor or N-type MOS transistor.

3. A deep sub-micron MOS integrated circuit die according to claim 1, wherein the deep sub-micron MOS integrated circuit die further comprises a microphone bias voltage source adapted to provide a predetermined DC bias voltage between a pair of terminals of the deep sub-micron MOS integrated circuit die.

4. A deep submicron MOS integrated circuit die according to claim 3, wherein bias voltage source is adapted to provide a DC bias voltage within the range 4-10 V.

5. A deep sub-micron MOS integrated circuit die according to claim 3, wherein the bias voltage source is adapted to provide the DC bias voltage to the first signal input terminal.

6. A deep sub-micron MOS integrated circuit die according to claim 1, wherein the first signal input terminal is coupled to the thick-oxide transistor via a DC blocking capacitor.

7. A deep sub-micron MOS integrated circuit die according to claim 1, wherein an input capacitance of the first signal input terminal is less than 50 pF.

8. A deep sub-micron MOS integrated circuit die according to claim 1, wherein an input impedance at the first signal input terminal is larger than 10 GΩ.

9. A deep sub-micron MOS integrated circuit die according to claim 1, wherein a A-weighted input referred noise, referred to the first signal input terminal, is less than 2 μV RMS.

10. A deep sub-micron MOS integrated circuit die according to claim 1, wherein a flicker noise corner of an input referred noise voltage density is less than 1 kHz.

11. A deep sub-micron MOS integrated circuit die according to claim 1, wherein the thickness of the gate oxide of the thick-oxide transistor is within the range 8-20 nm.

12. A deep sub-micron MOS integrated circuit die according to claim 1, wherein the gate oxide of the thick-oxide transistor comprises nitrided silicon-dioxide.

13. A portable communication device comprising:
a deep sub-micron MOS integrated circuit die, the deep sub-micron MOS integrated circuit die comprising a preamplifier including a first signal input terminal for receipt of electrical signals generated by an associated electro-acoustical transducer, said first signal input terminal being operatively coupled to an input stage of the preamplifier, said input stage comprising a thick-oxide transistor, said electro-acoustical transducer having a transducer capacitance within the range of 0.5-10 pF, and wherein a gate capacitance of the thick-oxide transistor is within the range of 0.5-10 pF and a thickness of a gate oxide of the thick-oxide transistor is within the range of 8-40 nm,
wherein said portable communication device comprises one or more of a cell phone, hearing aid, PDA, game console, or portable computer.

14. A condenser microphone assembly comprising:
a condenser microphone transducer comprising adjacently positioned diaphragm and back-plate members having an air gap there between, wherein the condenser microphone transducer has a transducer capacitance within the range of 0.5-10 pF,
a deep sub-micron MOS integrated circuit die comprising a preamplifier comprising a first signal input terminal for receipt of electrical signals generated by the condenser microphone transducer, said first signal input terminal being operatively coupled to an input stage of the preamplifier, said input stage comprising a thick-oxide transistor having a gate capacitance within the range of 0.5-10 pF and a gate oxide having a thickness within the range of 8-40 nm.

15. A condenser microphone assembly according to claim 14, wherein the condenser microphone transducer comprises a MEMS microphone transducer.

16. A condenser microphone assembly according to claim 14, further comprising a microphone housing, the microphone housing comprising:
a sound input port acoustically connected to the condenser microphone transducer, and
a plurality of externally accessible electrical terminals,
wherein the deep sub-micron MOS integrated circuit die is arranged inside the microphone housing.

17. A condenser microphone assembly according to claim 14, wherein the preamplifier further comprises a second input terminal, and wherein the first and second signal input terminals are operatively coupled to the diaphragm and back-plate members, respectively.

18. A condenser microphone assembly according to claim 14, wherein the thick-oxide transistor of the preamplifier comprises a P-type MOS transistor or N-type MOS transistor.

19. A condenser microphone assembly according to claim 18, wherein the deep sub-micron MOS integrated circuit die further comprises a microphone bias voltage source adapted to provide a predetermined DC bias voltage between a pair of terminals of the deep sub-micron MOS integrated circuit die.

20. A condenser microphone according to claim 19, wherein the bias voltage source is adapted to provide a DC bias voltage within the range 4-10 V.

21. A condenser microphone assembly according to claim 19, wherein the bias voltage source is adapted to provide the DC bias voltage to the first signal input terminal.

22. A condenser microphone assembly according to claim 14, wherein the first signal input terminal is coupled to the thick-oxide transistor via a DC blocking capacitor.

23. A condenser microphone assembly according to claim 14, wherein an input capacitance of the first signal input terminal is less than 50 pF.

24. A condenser microphone assembly according to claim 14, wherein an input impedance at the first signal input terminal is larger than 10 GΩ.

25. A condenser microphone assembly according to claim 14, wherein a A-weighted input referred noise, referred to the first signal input terminal, is less than 2 μV RMS.

26. A condenser microphone assembly according to claim 14, wherein a flicker noise corner of an input referred noise voltage density is less than 1 kHz.

27. A condenser microphone assembly according to claim 14, wherein the thickness of the gate oxide of the thick-oxide transistor is within the range 8-20 nm.

28. A condenser microphone assembly according to claim 14, wherein the gate oxide of the thick-oxide transistor comprises nitrided silicon-dioxide.

* * * * *